United States Patent
Banine

(10) Patent No.: US 6,456,362 B1
(45) Date of Patent: Sep. 24, 2002

(54) INTEGRATING WAVEGUIDE FOR USE IN LITHOGRAPHIC PROJECTION APPARATUS

(75) Inventor: Vadim Y. Banine, Helmond (NL)

(73) Assignee: ASML Netherlands B.V., Veldhoven (NL)

(*) Notice: Subject to any disclaimer, the term of this patent is extended or adjusted under 35 U.S.C. 154(b) by 0 days.

(21) Appl. No.: 09/584,722

(22) Filed: Jun. 1, 2000

(30) Foreign Application Priority Data

Jun. 4, 1999  (EP) .............................................. 99201768

(51) Int. Cl.[7] ........................ G03B 27/54; G03B 27/00; G03B 27/72; F21V 7/04
(52) U.S. Cl. .............................. 355/67; 355/1; 355/71; 362/551; 385/901
(58) Field of Search .................................. 362/551, 554, 362/556, 558; 385/115, 901; 355/1, 53, 67, 71; 359/503, 350, 351

(56) References Cited

U.S. PATENT DOCUMENTS

| | | | | |
|---|---|---|---|---|
| 5,059,013 A | * | 10/1991 | Jain | 359/503 |
| 5,175,755 A | | 12/1992 | Kumakhov | 378/34 |
| 5,302,999 A | * | 4/1994 | Oshida et al. | 355/1 |
| 5,406,351 A | * | 4/1995 | Sardella et al. | 355/53 |
| 5,473,408 A | * | 12/1995 | Hoffman et al. | 355/53 |
| 5,601,733 A | * | 2/1997 | Partio | 219/121.7 |
| 6,002,466 A | * | 12/1999 | Brauch et al. | 355/53 |
| 6,031,598 A | * | 2/2000 | Tichenor et al. | 355/67 |
| 6,067,146 A | * | 5/2000 | Mulkens et al. | 355/71 |
| 6,118,577 A | * | 9/2000 | Sweatt et al. | 359/351 |
| 6,142,641 A | * | 11/2000 | Cohen et al. | 359/859 |
| 6,151,155 A | * | 11/2000 | Durfee, III et al. | 359/332 |
| 6,236,449 B1 | * | 5/2001 | Tanitsu | 355/67 |

FOREIGN PATENT DOCUMENTS

WO    WO 99/57596    11/1999

OTHER PUBLICATIONS

Polycapillary Collimator for Point Source Proximity X–ray Lithography; J. Vac. Sci. Technol. B 11(6), Nov./Dec. 1993; American Vacuum Society; pp. 3003–3007.
Collimator for X–Ray Lithography; IBM Technical Disclosure Bulletin; vol. 33, No. 4; Sep. 1990.

* cited by examiner

Primary Examiner—Russell Adams
Assistant Examiner—R. E Fuller
(74) Attorney, Agent, or Firm—Pillsbury Winthrop LLP

(57) ABSTRACT

A lithographic projection apparatus includes an illumination system for supplying a projection beam of electromagnetic radiation having a wavelength less than or equal to 50 nm, a mask table provided with a mask holder for holding a mask, a substrate table provided with a substrate holder for holding a substrate, a projection system for imaging an irradiated portion of the mask onto a target portion of the substrate, wherein the radiation system comprises an integrating element disposed in the path of the radiation, the integrating element comprising a hollow waveguide.

20 Claims, 5 Drawing Sheets

— Mo
-- SiO₂

INTEGRATING WAVEGUIDE FOR USE IN LITHOGRAPHIC PROJECTION APPARATUS

FIELD OF THE INVENTION

The invention relates to integrators for use in lithographic projection apparatus comprising:

- an illumination system for supplying a projection beam of electromagnetic radiation having a wavelength of less than about 50 nm;
- a first object table provided with a first object holder for holding a mask;
- a second object table provided with a second object holder for holding a substrate; and
- a projection system for imaging an irradiated portion of said mask onto a target portion of said substrate.

More particularly, the invention relates to such a device in which the electromagnetic radiation is extreme ultra-violet light (EUV), typically with a wavelength below about 15 nm. An example of a wavelength in the EUV region which is gaining considerable interest in the lithography industry is 13.4 nm, though there are also other promising wavelengths in this region, such as 11 nm, for example.

BACKGROUND OF THE INVENTION

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include elements operating according to any of these principles for directing, shaping or controlling the projection beam, and such elements may also be referred to below, collectively or singularly, as a "lens". In addition, the first and second object tables may be referred to as the "mask table" and the "substrate table", respectively. Further, the lithographic apparatus may be of a type having two or more mask tables and/or two or more substrate tables. In such "multiple stage" devices the additional tables may be used in parallel, or preparatory steps may be carried out on one or more tables while one or more other tables are being used for exposures.

Lithographic projection apparatus can be used, for example, in the manufacture of integrated circuits (ICs). In such a case, the mask (reticle) may contain a circuit pattern corresponding to an individual layer of the IC, and this pattern can be imaged onto an exposure area (die) on a substrate (silicon wafer) which has been coated with a layer of energy-sensitive material (resist). In general, a single wafer will contain a whole network of adjacent dies which are successively irradiated via the reticle, one at a time. In one type of lithographic projection apparatus, each die is irradiated by exposing the entire reticle pattern onto the die at once; such an apparatus is commonly referred to as a wafer stepper. In an alternative apparatus—which is commonly referred to as a step-and-scan apparatus—each die is irradiated by progressively scanning the reticle pattern under the projection beam in a given reference direction (the "scanning" direction) while synchronously scanning the wafer table parallel or anti-parallel to this direction; since, in general, the projection system will have a magnification factor M (generally<1), the speed V at which the wafer table is scanned will be a factor M times that at which the reticle table is scanned. More information with regard to lithographic devices as here described can be gleaned from International Patent Application WO97/33205, for example.

Until very recently, lithographic apparatus contained a single mask table and a single substrate table. However, machines are now becoming available in which there are at least two independently moveable substrate tables; see, for example, the multi-stage apparatus described in International Patent Applications WO98/28665 and WO98/40791. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner it is possible to increase substantially the machine throughput, which in turn improves the cost of ownership of the machine. It should be understood that the same principle could be used with just one substrate table which is moved between exposure and measurement positions.

In the case of the current invention, which encompasses electromagnetic radiation in the EUV range, the projection system will generally consist of an array of mirrors, and the mask will be reflective; see, for example, the apparatus discussed in WO 99/57596 (P-0111). The radiation in this case can be produced by various known means, such as:

- by suitable laser-irradiation of a gas, liquid or solid;
- on the basis of a plasma source;
- with the aid of an undulator/wiggler placed around the path of an electron beam in a synchrotron or storage ring.

An example of an illuminator comprised in the illumination system and suitable for use with such radiation is described in European Patent Application no 98204237.6 (P-0122), whereas a suitable condenser for use with EUV is described in European Patent Application no 00300784.6 (P-0129).

In general, it will be desirable to incorporate an integrating element in the illumination system, which element serves to improve the intensity uniformity throughout the cross-section of the projection beam prior to the mask. In the case of UV lithography, such an integrating element ("integrator") may comprise a so-called fly-eye lens, or a refractive bar (such as a quartz rod). However, such integrators are not suitable for use with radiation in the EUV range, and alternatives have therefore been sought. To date, the use of alternatives such as ripple plates, multilayer mirrors and wigglers has been proposed.

SUMMARY OF THE INVENTION

It is an object of the invention to provide an alternative integrator for use with electromagnetic radiation having a wavelength of 50 nm or less, and particularly for use with EUV.

These and other objects are achieved in a lithographic projection apparatus comprising:

- an illumination system for supplying a projection beam of electromagnetic radiation having a wavelength of less than about 50 nm;
- a first object table provided with a first object holder for holding a mask;
- a second object table provided with a second object holder for holding a substrate;
- a projection system for imaging an irradiated portion of said mask onto a target portion of said substrate; and an integrating element disposed in the path of the radiation in the illumination system, the integrating element comprising a hollow waveguide.

The inventors have demonstrated that such an integrator can have a surprisingly high efficiency and transmission, and lends itself to many varied applications. Preferential embodiments of the invention are specified further in the claims, and a number of these embodiments are elucidated below in the embodiments and figures.

The invention also relates to a method of manufacturing a device using a lithographic projection apparatus comprising:

an illumination system for supplying a projection beam of electromagnetic radiation having a wavelength of less than about 50 nm;

a first object table provided with a first object holder for holding a mask;

a second object table provided with a second object holder for holding a substrate; and a projection system for imaging an irradiated portion of said mask onto a target portion of said substrate; the method comprising the steps of:

providing a mask bearing a pattern to said first object table;

providing a substrate having a radiation-sensitive layer to said second object table;

irradiating portions of the mask with said projection beam; and imaging irradiated portions of the mask onto target portions of the substrate;

characterized in that, prior to being directed onto the mask, the projection beam is passed through an integrating element which comprises a hollow waveguide.

In a manufacturing process using a lithographic projection apparatus according to the invention a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices (dies) will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "exposure area", respectively.

In the present document, the invention is described using a reference system of orthogonal X, Y and Z directions and rotation about an axis parallel to the I direction is denoted Ri. Further, unless the context otherwise requires, the term "vertical" (Z) used herein is intended to refer to the direction normal to the substrate or mask surface, rather than implying any particular orientation of the apparatus.

BRIEF DESCRIPTION OF THE DRAWINGS

The invention and its attendant advantages will be further described below with reference to exemplary embodiments and the accompanying schematic drawings, whereby.

In the drawings, like parts are identified by like reference numerals.

DETAILED DESCRIPTION OF THE EMBODIMENTS

Embodiment 1

Figure 1:
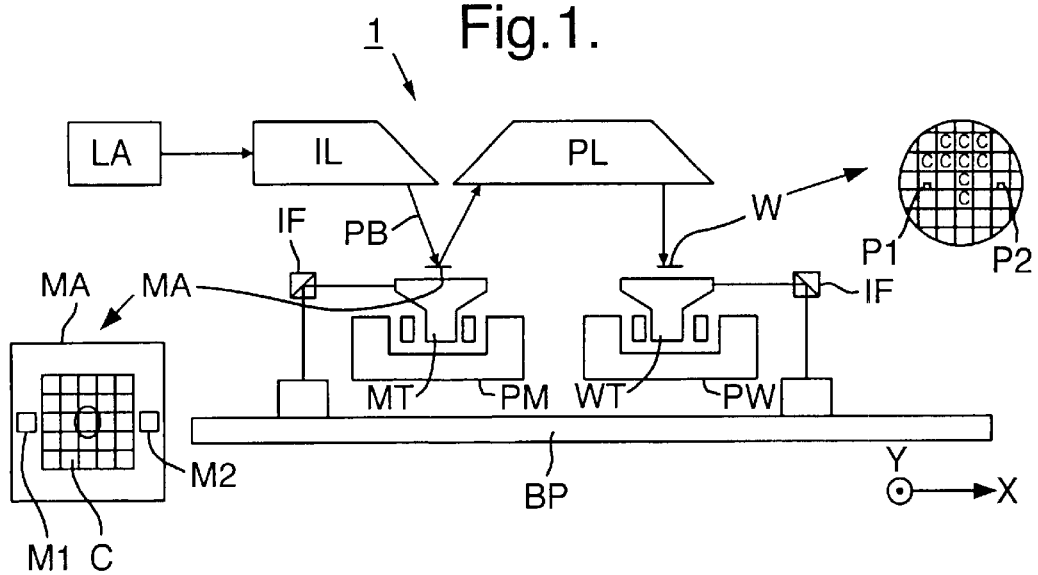
FIG. 1 depicts a lithographic projection apparatus according to a first embodiment of the invention.

FIG. 1 schematically depicts a lithographic projection apparatus according to the invention. The apparatus comprises:

a radiation system LA, IL for supplying a projection beam PB of radiation (e.g. UV or EUV radiation);

a first object table (mask table) MT provided with a mask, or first object, holder for holding a mask MA (e.g. a reticle), and connected to first positioning means for accurately positioning the mask with respect to item PL;

a second object table (substrate or wafer table) WT provided with a substrate, or second object, holder for holding a substrate W (e.g. a resist-coated silicon wafer), and connected to second positioning means for accurately positioning the substrate with respect to item PL;

a projection system ("lens") PL (e.g. a refractive or catadioptric system, a mirror group or an array of field deflectors) for imaging an irradiated portion of the mask MA onto an exposure area C (die) of a substrate W held in the substrate table WT.

As here depicted, the apparatus is of a reflective type (i.e. has a reflective mask). However, in general, it may also be of a transmissive type, for example.

The radiation system includes a source LA (e.g. an undulator or wiggler provided around the path of an electron beam in a storage ring or synchrotron, or a laser plasma source) which produces a beam of EUV radiation. This beam is passed along various optical components comprised in the illumination system IL—e.g. beam shaping optics, an integrator and a condenser—also included in the radiation system so that the resultant beam PB has a desired shape and intensity distribution in its cross-section.

The beam PB subsequently intercepts the mask MA which is held in a mask holder on a mask table MT. Having passed through the mask MA, the beam PB passes through the lens PL, which focuses the beam PB onto an exposure area C of the substrate W. With the aid of the interferometric displacement measuring means IF, the substrate table WT can be moved accurately by the second positioning means, e.g. so as to position different exposure areas C in the path of the beam PB. Similarly, the first positioning means can be used to accurately position the mask MA with respect to the path of the beam PB, e.g. after mechanical retrieval of the mask MA from a mask library. In general, movement of the object tables MT, WT will be realized with the aid of a long-stroke module (course positioning) and a short-stroke module (fine positioning), which are not explicitly depicted in FIG. 1. In the case of a waferstepper (as opposed to a step-and-scan apparatus) the reticle table may be connected only to a short-stroke positioning device, to make fine adjustments in mask orientation and position.

The depicted apparatus can be used in two different modes:

1. In step-and-repeat (step) mode, the mask table MT is kept essentially stationary, and an entire mask image is projected at once (i.e. a single "flash") onto an exposure area C. The substrate table WT is then shifted in the X and/or Y directions so that a different exposure area C can be irradiated by the beam PB;

2. In step-and-scan (scan) mode, essentially the same scenario applies, except that a given exposure area C is not exposed in a single "flash". Instead, the mask table MT is movable in a given direction (the so-called "scan direction", e.g. the Y direction) with a speed v, so that the projection beam PB is caused to scan over a mask image; concurrently, the substrate table WT is moved in the same or opposite direction at a speed V=Mv, in which M is the magnification of the lens PL (typically, M=¼ or ⅕). In this manner, a relatively large exposure area C can be exposed, without having to compromise on resolution.

Figure 2:
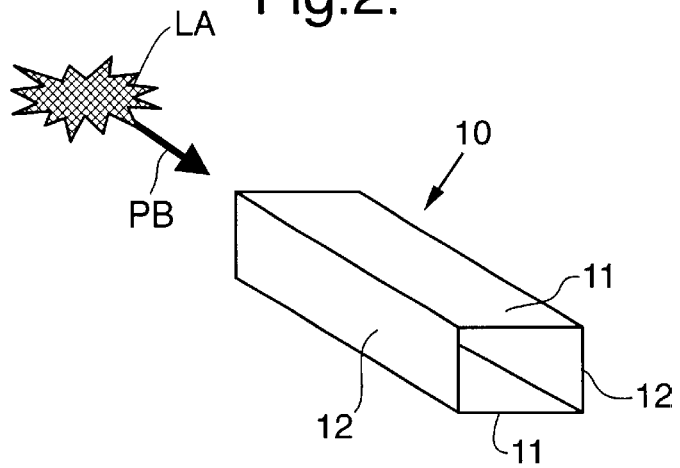
FIG. 2 shows a hollow tube usable as an integrator in the current invention.
Figure 3:
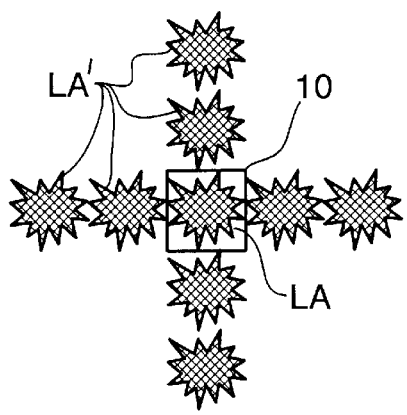
FIG. 3 depicts a virtual source configuration as produced by an integrator such as that in FIG. 2.

FIG. 2 shows an integrator 10 incorporated in the illumination system IL. It comprises two pairs of parallel mirrors 11, 12 made of a metal, such as Mo, W, Ru, Al and their alloys, arranged in mutual opposition as shown in FIG. 2. The choice of metal will depend, at least in part, on the wavelength with which the integrator is to be used. For example, W is best for radiation of wavelength 13.4 nm, Ru is also acceptable for 11.4 nm whereas Al is preferred for 40 nm. The EUV source LA radiates as in FIG. 2, for example, and the incoming EUV radiation PB falls on the mirrors at grazing incidence. The resulting multiple reflections will produce imaginary sources LA' (similar to a quartz rod in standard UV lithography), as shown in FIG. 3. This results in an increase of the dose uniformity at the exit-end of the integrator due to two factors:

a. the end is situated further from the source b. the effective number of sources is increased.

Figure 4:
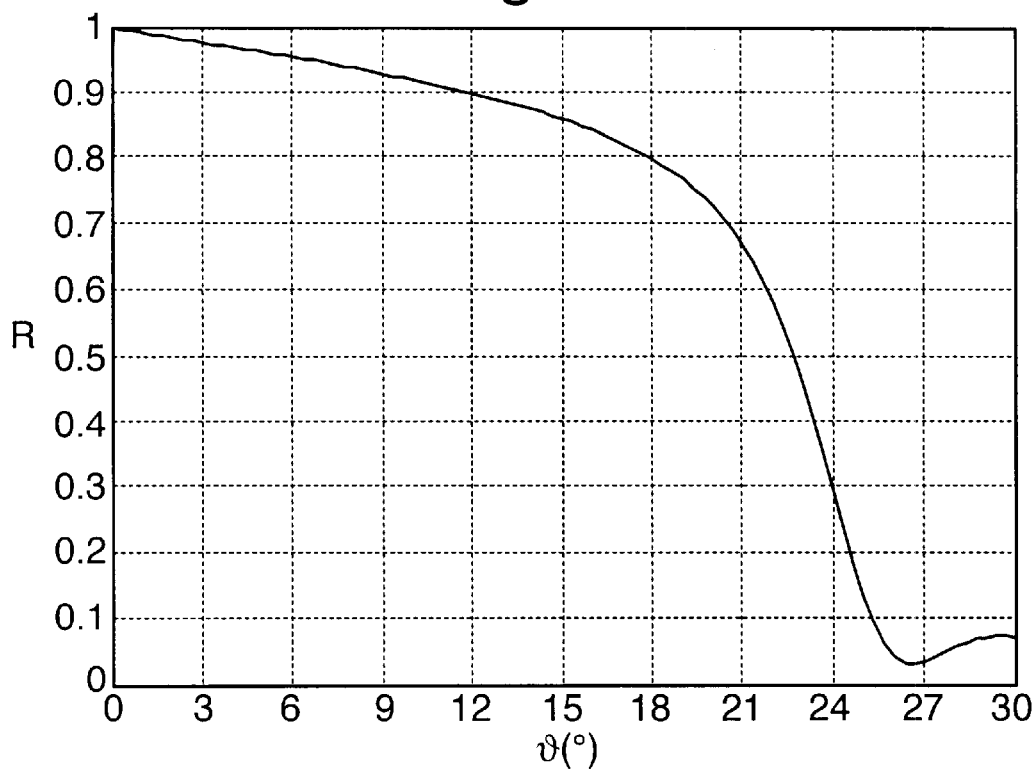
FIG. 4 graphically depicts the reflectivity of Mo at 13.4 nm as a function of grazing-incidence angle.
Figure 5:
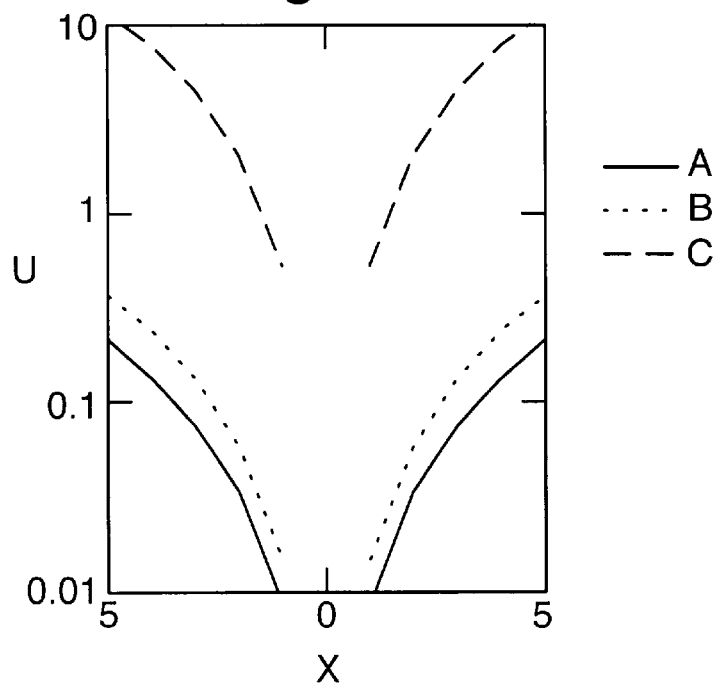
FIG. 5 graphically depicts an improvement in dose uniformity obtainable using an embodiment as shown in FIG. 2.

In a specific case, the integrator described above has a uniform rectangular cross-section of dimensions 10 cm×0.6 cm (corresponding to the dimensions of the illuminating slit at mask level), and is situated at a distance of 13.7 cm from the source; this corresponds to a maximum incidence angle of 20°. If the integrator walls are comprised of Mo (at least at the surface), then the reflectivity, R, in a range of incidence angle, $\theta$, from 0° to 20° will vary from 1 to 0.75, as shown in FIG. 4. If now the length of the integrator is chosen such that a maximum of 3 reflections is permitted, thus producing 12 additional sources, one would expect the integral transmission of the system to become 78% of the original value. FIG. 5 shows dose non-uniformity U versus distance X along the exposure slit and presents a comparison of the original (entrance) dose distribution, line C, with the dose distribution at the exit of the system, both scanned, line A, and not scanned, line B. An initial non-uniformity of more than 10% is improved to a much more desirable level of less than 1%. If the initial non-uniformity is higher, then more reflections will generally be needed.

In this way, the system is used not only as an integrator but also as a collector. If the incidence angle is restricted to 10°, the integral transmission of the system will be about 90%.

Besides being rectangular (of any side ratio), the cross-section of the integrator may also be round or oval; this will change the configuration of the resulting imaginary sources. The system can also be converging, which changes the shape of the emergence slit. In addition, the system can be used as a condenser, and will generally be less sensitive to contamination (e.g. by resist debris) than a multilayer collector.

The price of the depicted grazing-incidence system can be much lower than that of a multilayer-based system. Broadly speaking, any kind of material can be used for the integrator according to the invention. Mo is a preferable option because of its high reflectivity, but even $SiO_2$ can deliver more than 90% reflection for angles of incidence less than 1°.

The smaller the angle of incidence, the higher the system transmission, the more reflections that can be allowed, and the higher the emergent dose uniformity.

Embodiment 2

Fiber-optics can be used for focusing and collimation of X-rays in X-ray systems, whereby use is made of hollow fibers. The size of these fine capillaries typically ranges from about 3 to 50 $\mu$m, but production of capillaries of other sizes is also possible. Generally, these capillaries are made of $SiO_2$.

According to the invention, such fibers can also be employed in EUV applications.

Figure 6:
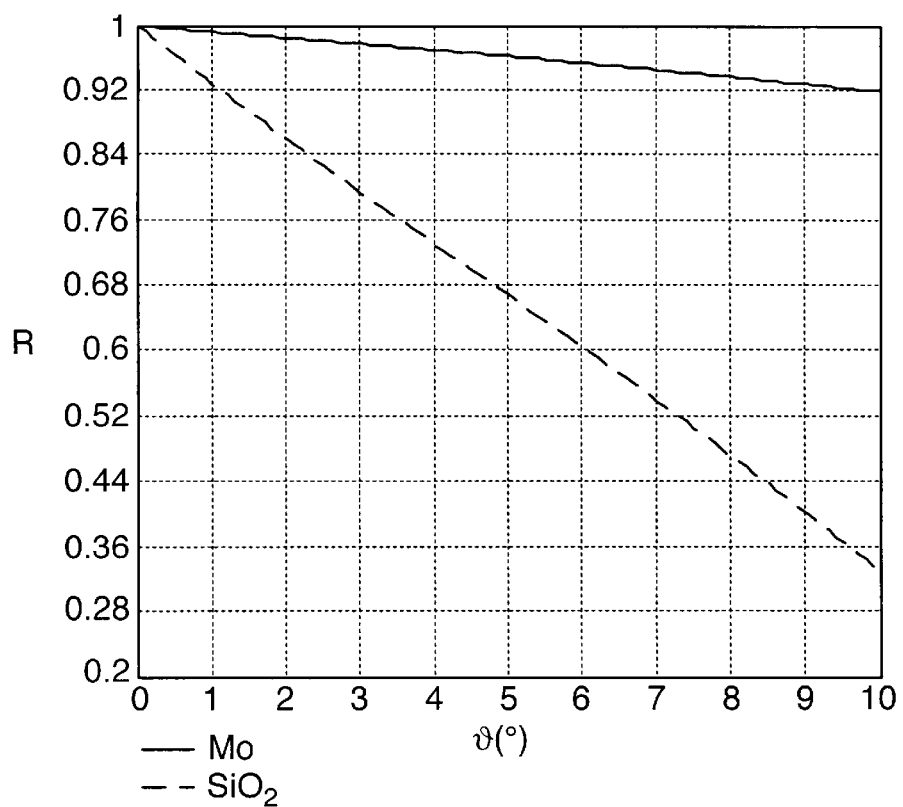
FIG. 6 graphically depicts the reflectivity of Mo and $SiO_2$ at 13.4 nm as a function of grazing-incidence angle, in the case of an optical fiber having an Mo or $SiO_2$ inner surface.

If the angle of incidence is small enough (in other words if the capillary diameter is small enough to cause small incidence angles), a grazing-incidence internal reflection of high reflectivity occurs. FIG. 6 presents a graph of the reflectivity, R, as a function of the incidence angle, θ, for $SiO_2$ (glass or quartz) and Mo. The smaller the incidence angle, the higher the reflectivity. Moreover, the longer the capillary, the more internal reflections that can be permitted for the same total loss. In principle, a broad range of materials can be used in such fibers; in particular, the inner surface of such fibers may be coated with a metallic layer, e.g. of Mo, W, Ru, Al and their alloys.

A particular source of emergent intensity loss is that due to the dead volume in packing the capillaries together, as a result of their typically circular cross-section. The loss in this case can be about 5–25% (depending on packaging and wall thickness). To alleviate this problem, one can make capillaries of a different cross-sectional shape (e.g. a honeycomb shape), so as to improve packing density.

The total transmission T of the system is a function of the number of reflections ($n_{refl}$), capillary diameter (d), reflectivity as a function of angle of incidence (R(θ)) and collection angle (α). The number of reflections, $n_{refl}$, can be expressed as a function of the length (L) of the fiber, d and α. The total transmission then can be written as:

$$T = R(\alpha/2)^{\frac{L \tan(\frac{\alpha}{2})}{d}}$$

Figure 7:
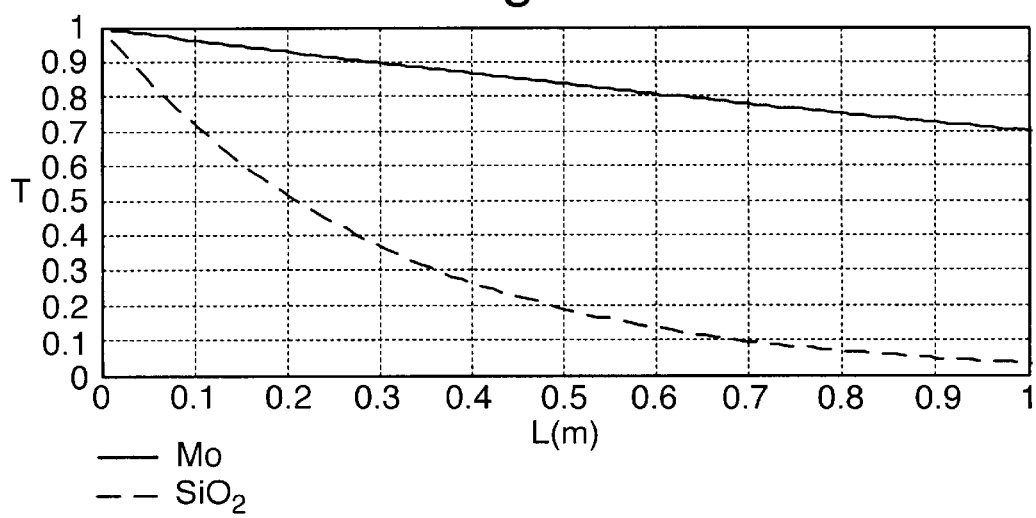
FIG. 7 relates to FIG. 6, and shows the total transmission of such an integrator as a function of its length.

For example, if d=0.1 mm, α1° and R(0.5°)=0.996 for Mo, and R(0.5°)=0.963 for $SiO_2$, all at a wavelength of 13.4 nm, then total transmission, T, as a function of the length L(m) of the waveguide is as shown in FIG. 7. For a glass fiber, a total loss of 50% will be reached at about 22 cm; in the case of Mo, even after 1 m the total transmission is still about 70%. At smaller angles, the fiber can be made several meters long and yet give the same total transmission value (0.2°→5.5 m for glass).

In some applications, it may be useful to bend the capillaries, whereby additional grazing angle will be introduced. Such bending can be performed:

- smoothly, producing small bends per reflection, with many reflections;
- abruptly, producing large bends per reflection, with less reflections.

Figure 8:
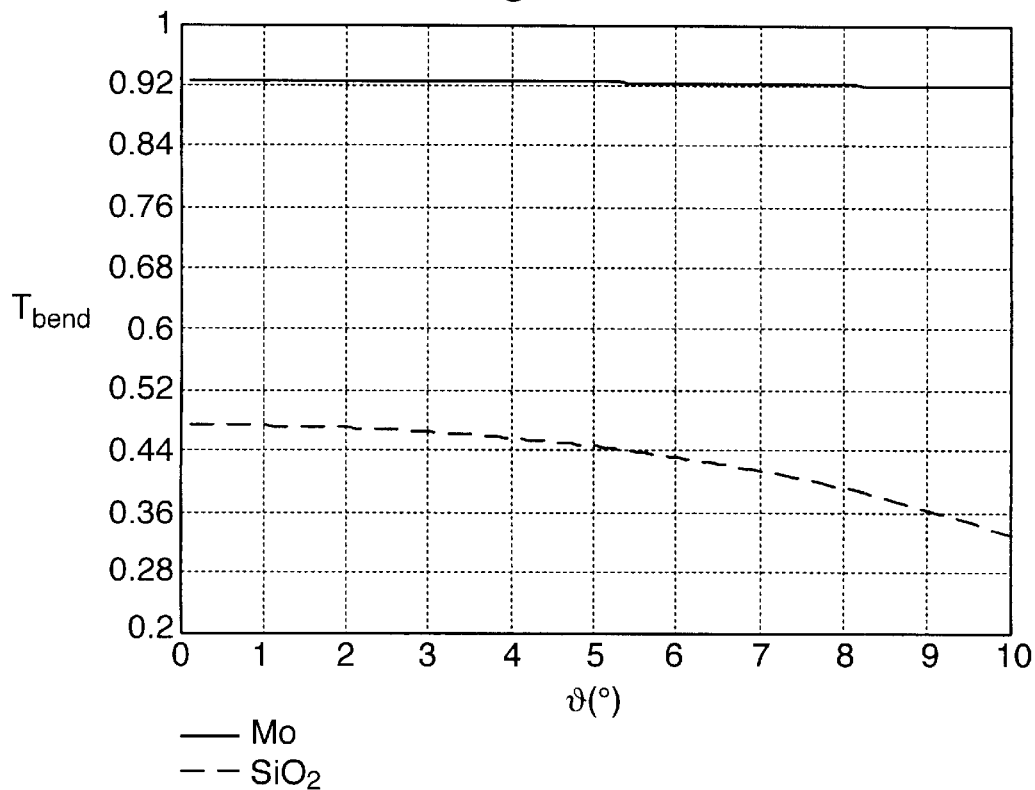
FIG. 8 relates to FIG. 6, and pertains to the case of a bent fiber.

The total bending transmission ($T_{bend}$) can be expressed as follows, $$T_{bend} = (R(\alpha refl))^{\frac{\alpha refl}{\alpha bend}}$$

where αrefl is the reflection angle at each incidence. FIG. 8 shows the bending transmission $T_{bend}$ of the capillary (for a bend of 10°) as a function of the angle, θ, at each incidence. As can be seen from FIG. 8, smooth bending is preferable. Mo (or most other metals, or glass with a metal coating) generally performs much better than plain glass, though the use of glass is still, of course, possible.

Figure 9:
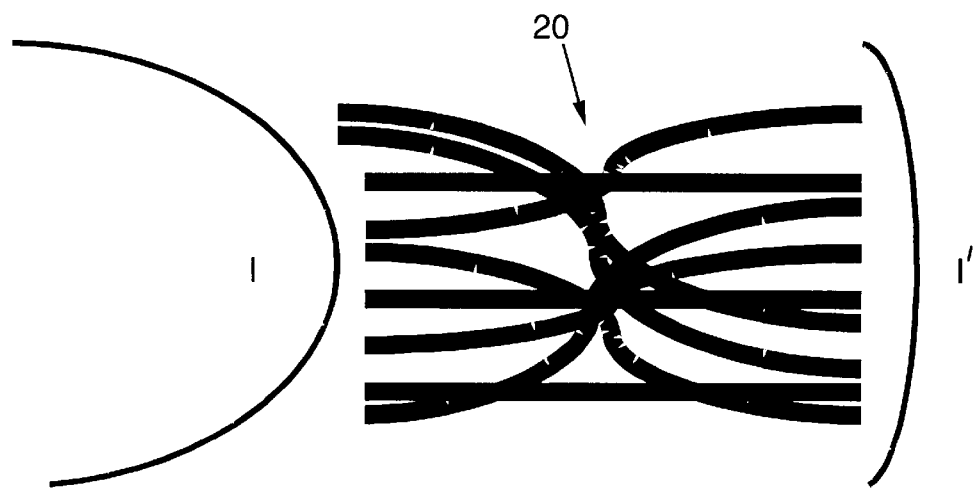
FIG. 9 shows an embodiment of an integrator according to the invention, using interwoven optical fibers.
Figure 10:
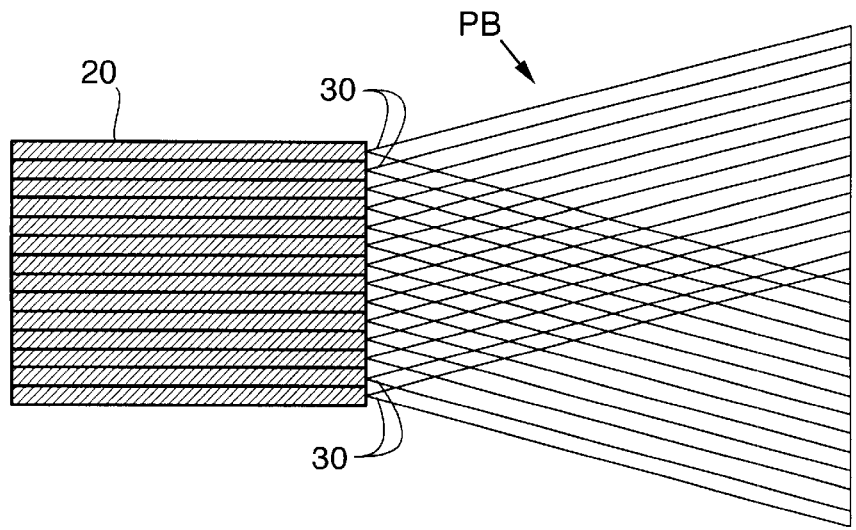
FIG. 10 shows the mixing effect of light at a distance from the exitends of a bundle of optical fibers.
Figure 11:
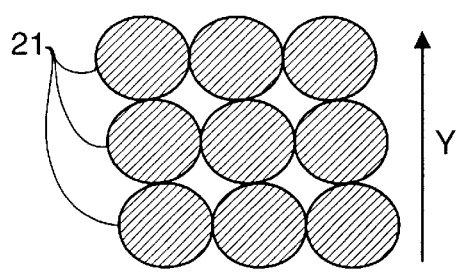
FIG. 11 depicts a non-orthogonal packing arrangement of optical fibers in another embodiment of an integrator according to the invention.

If an original radiation distribution, I, from a source is not uniform, it can be collected into a set of interwoven fibers, as shown in FIG. 9. The fibers are interwoven in such a pattern as to produce the desired radiation distribution I'. A high spatial frequency dose variation, introduced by the separation of the original radiation into separate fibers, can be smoothed at a distance from the fiber exit-ends due to intersection of the radiation cones 30 originating from different fibers, as shown in FIG. 10. Another possibility in the case of a step-and-scan apparatus is to pack the fibers 21 such that each row is slightly shifted in a direction perpendicular to the scanning direction, e.g. Y, as shown in FIG. 11. In this way, a non-orthogonal packing arrangement is obtained.

Figure 12:
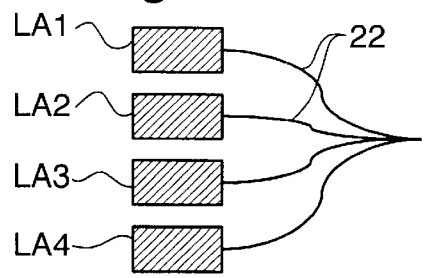
FIG. 12 shows an integrator which also acts as a multiplexer.
Figure 13:
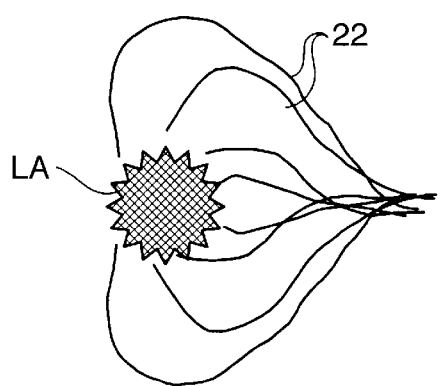
FIG. 13 shows an integrator which also acts as a collector.

If a source étendue (the term 'étendue' refers to the product of the size of the source and the solid emission angle) is much smaller than required by a lithographic system, then several sources LA1–LA4 of the same kind can be multiplexed using fibers 22 and inter-weaving, as shown in FIG. 12. A system of fibers 22 can also be used as a collector, as in FIG. 13. Such a collector will be free of debris at the exit-end of the fibers, and, if cheap enough, may be readily replaceable at the source end; however, if the source is debris-free, no such exchange will be necessary.

The fibers discussed above can be easily evacuated using differential pumping.

Embodiment 3

Figure 14:
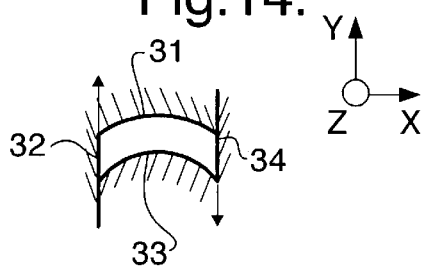
FIG. 14 is a cross-sectional view of another integrator according to the invention.
Figure 15:
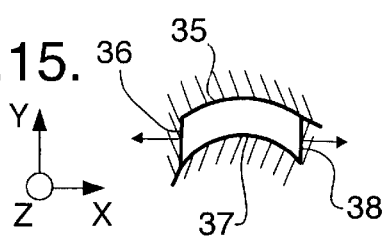
FIG. 15 is a cross-sectional view of another integrator according to the invention.

In a third embodiment of the invention, which similar to the first embodiment save as described below, the waveguide is adjustable in either the scanning direction, e.g. Y, or the direction perpendicular thereto, e.g. X. These two variations of the third embodiment are shown in FIGS. 14 and 15 which show integrating waveguides according to the invention with one pair of mirrors curved so as to produce an arch-shaped (in cross-section) projection beam. The principle of the third embodiment may also be used with other shapes of integrator, e.g. rectangular.

As shown in FIG. 14 which is a cross-section of the waveguide in the XY plane, in the first variation of the third embodiment, the four mirrors 31 to 34 making up the hollow waveguide are joined together in pairs; mirror 31 which is generally parallel to the XZ plane is joined to mirror 32 which is generally parallel to the YZ plane while mirror 33 which is opposite mirror 33 is joined to mirror 34 which is opposite mirror 32. The free edge of mirror 31 abuts and is slidable against the reflecting surface of mirror 34 and the free edge of mirror 33 likewise abuts and is slidable against mirror 32. Thus, the joined mirrors 31, 32 may be moved relative to the joined mirrors 33, 34 in the Y direction. The width of the projection beam in the scanning direction will change accordingly.

FIG. 15 is a cross-section, similar to FIG. 14, of the second variation of the third embodiment. Again the mirrors are joined together in pairs—35 to 36 and 37 to 38. In the second variation however, the free edge of mirror 36, which is generally parallel to the YZ plane, abuts and slides against the reflecting surface of mirror 37, which is generally parallel to the XZ plane. Similarly the free edge of mirror 38 abuts and slides against mirror 35. In the second variation, the joined mirror pairs 35, 36 and 37, 38 are moveable relative to one another along an arc parallel to the planes of mirrors 35 and 37, generally in the X direction. In this way the width of the waveguide, and hence the illumination beam, in the direction perpendicular to the scanning direction is adjusted.

In both variations of the third embodiment, one or both of the joined pairs of mirrors can be moved with suitable actuators (not shown) to control the size of the illumination beam as desired, either between or during exposures. The type, number and capabilities of the actuators as well as the details of the accompanying control system can be selected for a specific application of the invention according to such factors as the size and mass of the mirrors, the desired range and accuracy of movement and the required speed of response.

While we have described above specific embodiments of the invention it will be appreciated that the invention may be practiced otherwise than described. The description is not intended to limit the invention.

What is claimed is:

1. A lithographic projection apparatus comprising:
   an illumination system constructed and arranged to supply a projection beam of electromagnetic radiation having a wavelength of in the range 8 nm to about 50 nm;
   a first object table provided with a first object holder constructed and arranged to hold a mask;
   a second object table provided with a second object holder constructed and arranged to hold a substrate;
   a projection system adapted to image an irradiated portion of said mask onto a target portion of said substrate; and
   an integrating element disposed in the path of the radiation in the illumination system, the integrating element comprising a hollow waveguide arranged with respect to the path of radiation such that radiation undergoes grazing incidence at an inner wall of said waveguide.

2. An apparatus according to claim 1, wherein the waveguide is arranged with respect to the path of the radiation such that the radiation will undergo grazing incidence at an inner wall of the waveguide with a grazing incidence angle with respect to the inner wall of less than about 20°.

3. An apparatus according to claim 1, wherein the waveguide comprises a hollow cylindrical pipe having an inner wall which at least partially comprises a metal layer.

4. An apparatus according to claim 3, wherein the metal is selected from the group comprising Mo, W, Ru, Al and their alloys.

5. An apparatus according to claim 1, wherein the waveguide has a generally rectangular cross-section with pairs of opposing walls, and that substantially the entire inner surface of the pipe is comprised of metal.

6. An apparatus according to claim 1, wherein said waveguide comprises two pairs of mirrors, each pair joined in a L-shaped configuration, a free edge of one mirror of each pair abutting generally perpendicular a reflecting surface of a mirror of the other pair and being slidable relative thereto to adjust the cross-section of said waveguide.

7. An apparatus according to claim 1 wherein said illumination system is adapted to produce a projection beam of extreme ultraviolet radiation.

8. An apparatus according to claim 7, wherein the extreme ultraviolet radiation has a wavelength between 8 and 20 nm.

9. An apparatus according to claim 8, wherein the wavelength is between 9 and 16 nm.

10. A lithographic projection apparatus comprising:
    an illumination system constructed and arranged to supply a projection beam of electromagnetic radiation having a wavelength in the range of 8 nm to about 50 nm;
    a first object table provided with a first object holder constructed and arranged to hold a mask;
    a second object table provided with a second object holder constructed and arranged to hold a substrate;
    a projection system adapted to image an irradiated portion of said mask onto a target portion of said substrate; and
    an integrating element disposed in the path of the radiation in the illumination system, the integrating element comprising a hollow optical fiber arranged with respect to the path of radiation such that radiation undergoes grazing incidence at an inner wall of said hollow optical fiber.

11. An apparatus according to claim 10, wherein the integrating element comprises a plurality of hollow optical fibers.

12. An apparatus according to claim 11, wherein the fibers are clustered side-by-side so that their longitudinal axes are substantially mutually parallel.

13. An apparatus according to claim 12, wherein at an end of the integrating element from which the radiation emerges, ends of the fibers are arranged in a non-orthogonal matrix.

14. An apparatus according to claim 11, wherein the fibers are at least partially interwoven.

15. An apparatus according to claim 11, wherein ends of the fibers through which the radiation emerges are arranged substantially side-by-side, and ends of the fibers through which the radiation enters are spatially distributed around, and directed toward, a common radiation source.

16. An apparatus according to claim 11, wherein ends of the fibers through which the radiation exits are arranged substantially side-by-side, and ends of the fibers through which the radiation enters are placed in proximity to, and directed toward, a plurality of radiation sources.

17. An apparatus according to claim 10, wherein inner walls of the fiber comprises a material selected from the group comprising $SiO_2$, quartz and plastics.

18. An apparatus according to claim 10, wherein at least part of an inner wall of the fiber is at least partially coated with a metal.

19. A method of manufacturing a device using a lithographic projection apparatus comprising:
    providing a mask bearing a pattern to a first object table;
    providing a substrate having a radiation-sensitive layer to a second object table;
    irradiating portions of the mask with a projection beam of electromagnetic radiation having a wavelength in the range of 8 nm to about 50 nm;
    imaging irradiated portions of the mask onto target portions of the substrate and
    passing the projection beam through a substantially straight hollow waveguide prior to irradiating the mask with the projection beam, said hollow waveguide being arranged with respect to the path of radiation such that radiation undergoes grazing incidence at an inner wall of said waveguide.

20. A semiconductor device manufactured in accordance with the method recited in claim 19.

* * * * *